(12) United States Patent
Weber (10) Patent No.: US 8,823,116 B2
(45) Date of Patent: Sep. 2, 2014

(54) HYBRID INTEGRATED COMPONENT AND METHOD FOR THE MANUFACTURE THEREOF

(71) Applicant: Heribert Weber, Nuertingen (DE)

(72) Inventor: Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/915,249

(22) Filed: Jun. 11, 2013

(65) Prior Publication Data

US 2013/0334626 A1 Dec. 19, 2013

(30) Foreign Application Priority Data

Jun. 14, 2012 (DE) .......................... 10 2012 210 052

(51) Int. Cl.
*H01L 29/84* (2006.01)

(52) U.S. Cl.
USPC ............. 257/416; 257/254; 257/419; 438/51; 438/53

(58) Field of Classification Search
USPC ................ 257/415–420, 254; 438/50, 51, 53; 381/175
See application file for complete search history.

(56) References Cited

U.S. PATENT DOCUMENTS

2011/0049652 A1   3/2011   Wu et al.
2013/0277772 A1*  10/2013  Bryzek .......................... 257/415

* cited by examiner

*Primary Examiner* — Matthew W Such
*Assistant Examiner* — Scott Stowe
(74) *Attorney, Agent, or Firm* — Kenyon & Kenyon LLP (57) ABSTRACT

A hybrid integrated component includes: at least one ASIC element having integrated circuit elements and a back-end stack; an MEMS element having a micromechanical structure, which extends over the entire thickness of the MEMS substrate; and a cap wafer. The hybrid integrated component is provided with an additional micromechanical function. The MEMS element is mounted on the ASIC element, so that a gap exists between the micromechanical structure and the back-end stack of the ASIC element. The cap wafer is mounted above the micromechanical structure of the MEMS element. A pressure-sensitive diaphragm structure having at least one deflectable electrode of a capacitor system is implemented in the back-end stack of the ASIC element, which diaphragm structure spans a pressure connection in the rear side of the ASIC element.

13 Claims, 12 Drawing Sheets

HYBRID INTEGRATED COMPONENT AND METHOD FOR THE MANUFACTURE THEREOF

BACKGROUND OF THE INVENTION

1. Field of the Invention

The present invention relates to a hybrid integrated component, which includes an ASIC (application specific integrated circuit) element having integrated circuit elements and a back-end stack, an MEMS (micro-electromechanical system) element having a micromechanical structure, which extends over the entire thickness of the MEMS substrate, and a cap wafer. The MEMS element is mounted on the ASIC element in such a way that there is a gap between the micromechanical structure and the back-end stack of the ASIC element and the cap wafer is mounted above the micromechanical structure of the MEMS element. Furthermore, the present invention relates to a method for manufacturing such a hybrid integrated component.

2. Description of the Related Art

A vertically integrated component including an ASIC element, an MEMS element, and a cap wafer, and a method for the manufacturing thereof, are described in U.S. Patent Application Publication No. 2011/0049652 A1. The known method provides for initially processing an ASIC substrate, on which the starting substrate for the MEMS element is then bonded. Only then is a micromechanical structure produced in the MEMS substrate. In U.S. Patent Application Publication No. 2011/0049652 A1, this micromechanical structure includes a resiliently suspended seismic mass. Independently thereof, a cap wafer is structured and prepared for the mounting above the micromechanical structure of the MEMS substrate and on the ASIC substrate. The cap wafer thus processed is bonded on the ASIC substrate after the structuring of the MEMS substrate, so that the micromechanical structure is enclosed in a hermetically sealed way between the ASIC substrate and the cap wafer.

The known component is equipped with a capacitor assembly, which includes a deflectable electrode on the resiliently mounted seismic mass and stationary counter electrodes, which are implemented in a structured metal layer on the surface of the ASIC substrate. Depending on the function of the component as an inertial sensor or actuator, the capacitor system is either used for measuring signal detection or for activating the seismic mass.

The known component concept allows cost-effective mass production of robust components having a micromechanical function and a signal processing circuit. Not only are the individual component parts—ASIC element, MEMS element, and cap—manufactured in the wafer composite, the mounting thereof to form one component is also implemented on the wafer level. In addition, the MEMS functions and ASIC functions may be tested on the wafer level, and even the calibration of the individual components may take place on the wafer level even before the separation. In addition, the known components require a relatively small mounting area due to the stacked structure, which has a favorable effect on the manufacturing costs of the terminal equipment.

BRIEF SUMMARY OF THE INVENTION

The present invention provides an additional MEMS function in comparison to the known component concept, without substantial enlargement of the component "footprint" being necessary for this purpose. The component concept thus expanded additionally allows the implementation of components having multilayered micromechanical structures, for example, microphone and loudspeaker components.

This is achieved according to the present invention in that a pressure-sensitive diaphragm structure having at least one deflectable electrode of a capacitor system is implemented in the back-end stack of the ASIC element, in such a way that this diaphragm structure spans a pressure connection in the rear side of the ASIC element.

Accordingly, the known component concept is expanded according to the present invention by a structuring of the back-end stack of the ASIC element, in the case of which not only a standoff structure—as in the related art—is produced in the back-end stack, but rather also a micromechanical diaphragm structure having an independent sensor or actuator function is produced. Since the component structure additionally also includes an MEMS element having an independent MEMS function, robust components having a pressure sensor function and a further MEMS function independent thereof may thus be implemented very simply and cost-effectively, for example. The pressure sensor function of the ASIC diaphragm structure of a component according to the present invention may thus be combined, for example, with an inertial sensor function, which is implemented in the micromechanical structure of the MEMS element and is encapsulated with the aid of the cap wafer. The component structure according to the present invention is additionally very well suited for implementing components having a multilayered micromechanical structure, for example, for implementing capacitive microphone and loudspeaker components. The diaphragm structure in the back-end stack of the ASIC component is used here as an acoustically active diaphragm, while the backplate, i.e., the associated acoustically permeable counter element having the stationary counter electrode, is implemented in the micromechanical structure of the MEMS element. The cap wafer is used in this application to define the rear side volume. In any case, at least parts of a signal processing circuit for the MEMS functions of the component are advantageously integrated on the ASIC element.

According to the method of the present invention for manufacturing such a hybrid integrated component, an ASIC substrate is initially processed, circuit elements being integrated into the ASIC substrate. A back-end stack for interconnecting these circuit elements is then produced on the ASIC substrate. According to the present invention, a diaphragm structure having at least one deflectable electrode is applied in the back-end stack. An MEMS substrate is then mounted on the back-end stack of the ASIC substrate, so that there is a gap between the MEMS substrate and the back-end stack of the ASIC substrate. After the mounting on the ASIC substrate, the MEMS substrate is structured in its entire thickness. A stationary counter element as a carrier of at least one counter electrode for the deflectable electrode of the diaphragm structure may also be implemented in the area above the diaphragm structure applied in the back-end stack. According to the present invention, the diaphragm structure in the back-end stack is exposed in any case after the structuring of the MEMS substrate. A pressure connection is also produced in the rear side of the ASIC substrate. The cap wafer is mounted after the structuring of the MEMS substrate, either before or also only after the structuring of the ASIC substrate.

In one specific embodiment of the present invention, the diaphragm structure is exclusively applied layout-related in the back-end stack, in that the insulating layers and metallization levels of the back-end stack are deposited one on top of another and structured in a suitable way. The diaphragm structure is defined here by the metallization levels and the through contacts between the individual metallization levels, since the diaphragm structure is exposed in that the material of the insulating layers is removed in the diaphragm area using anisotropic and/or isotropic etching methods. The metallization levels and the through contacts function as the vertical and lateral etch stop or etch mask. In the case of this method variant, at least during the application of the diaphragm structure in the back-end stack, no special layer materials, deposition methods, and/or structuring methods are necessary, so that the application of the diaphragm structure does not cause any additional manufacturing expenditure. The material of the insulating layers is removed from the diaphragm area via passage openings in the micromechanical structure of the MEMS substrate and/or proceeding from the rear side of the ASIC substrate. Standard methods of semiconductor structuring may advantageously be used for this purpose. Since the metallization levels of the back-end stack are used as a vertical etch stop and through contacts between individual metallization levels function as a lateral etch stop, the surfaces of the diaphragm structure are each formed by one metallization level, which may be used as a capacitor electrode.

However, it is also conceivable to implement a diaphragm structure in which the surfaces are made of insulating levels of the multilayered metallization. This may be the case if the uppermost metallization level of the ASIC substrate is located in the diaphragm area below an insulating level and, during the production of the pressure connection, the process is stopped at a metallization level, but it is subsequently removed with the aid of a plasma etching process.

The manufacturing method of the present invention allows the implementation of greatly varying diaphragm structures in the back-end stack, so that the diaphragm properties may be adapted very well to the particular purpose or application of a component according to the present invention.

In one simplest specific embodiment of the present invention, the diaphragm structure is simply implemented in one metallization level of the back-end stack. The location of the metallization level within the back-end stack and therefore the distance of the diaphragm structure to the micromechanical structure of the MEMS element may be selected virtually freely. Depending on the desired thickness and stiffness, the diaphragm structures may also include multiple metallization levels of the back-end stack which are deposited directly one on top of another. In this case, the diaphragm structure itself may simply be used as the deflectable electrode.

If a greater diaphragm stiffness is required, the diaphragm structure may also extend over multiple metallization levels and interposed insulating layers of the back-end stack. If the two outer layers of such a diaphragm structure are metallization levels of the back-end stack, one or more deflectable electrodes of the capacitor system may also easily be implemented. In an advantageous refinement of this variant, only the middle area of the diaphragm structure is stiffened, in that it has a greater thickness than the edge area of the diaphragm structure. This may be achieved, for example, in that a diaphragm area having a layered structure is only incorporated over one metallization level or also a layered structure of lesser thickness is incorporated in the back-end stack. In the case of pressure effects, such diaphragm structures are preferably deformed in the thinner edge area, while the stiffened middle area having the electrode is deflected plane-parallel to the stationary counter electrode.

In the case of a sensor application, this results in linearization of the sensor signal. In the case of actuator applications, the activation of the diaphragm structure is thus simplified.

Another advantageous specific embodiment of the present invention is also directed to a preferably plane-parallel deflection of the electrode of the diaphragm structure in relation to the stationary counter electrode of the capacitor system. In this variant, the diaphragm structure includes a pressure-sensitive diaphragm element and an electrode element. The pressure-sensitive diaphragm element is incorporated in its edge area in the layered structure of the back-end stack, while the electrode element is only connected at points via a through contact to the pressure-sensitive diaphragm element, but otherwise is dissolved away from the layered structure of the back-end stack. Accordingly, pressure-related deformations of the pressure-sensitive diaphragm element result in a plane-parallel displacement of the electrode element.

DETAILED DESCRIPTION OF THE INVENTION

Figure 1A:
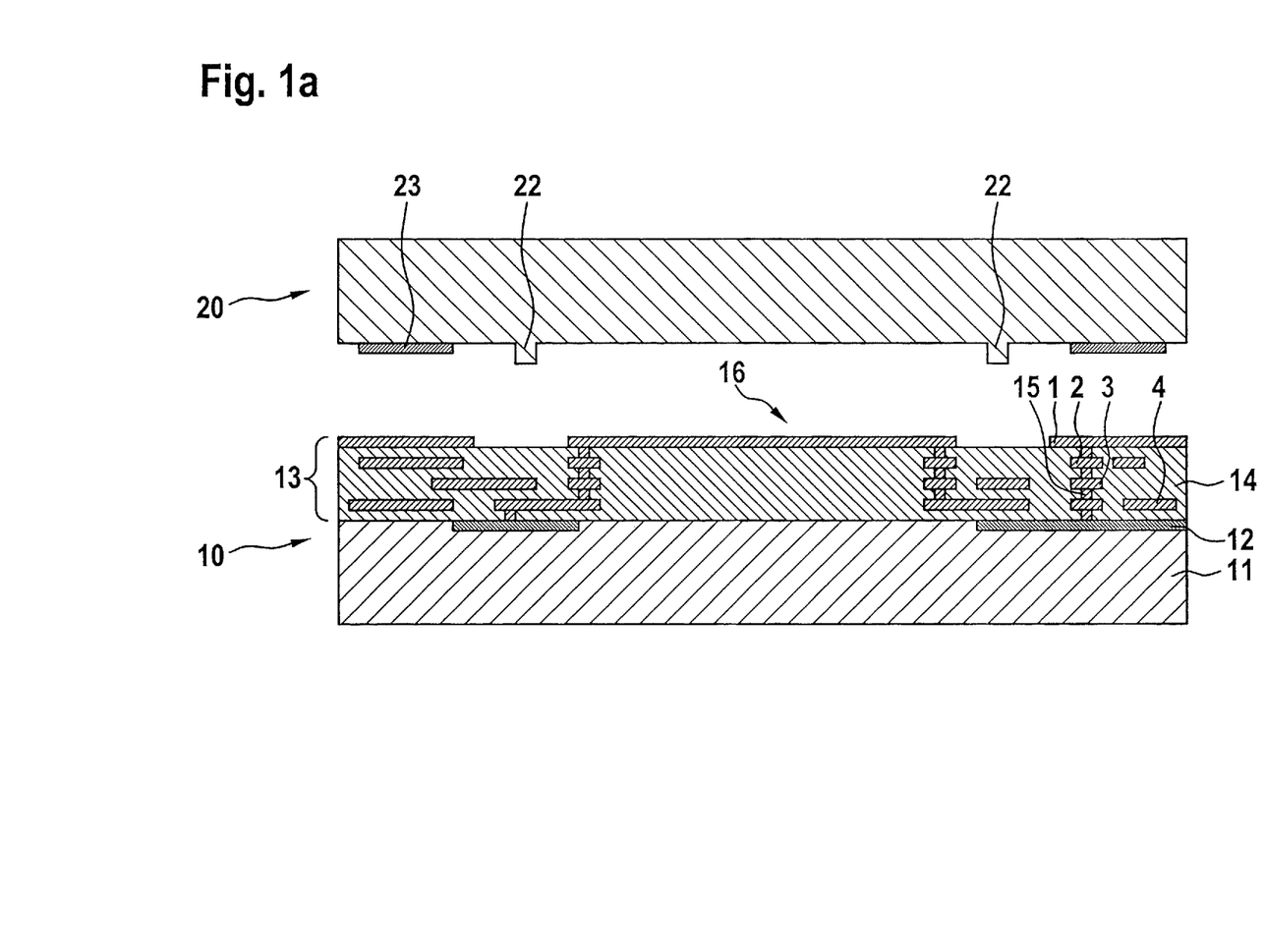
FIGS. 1a through 1f show the manufacturing of a microphone component 100 according to the present invention on the basis of schematic sectional views.

For the manufacture of a component according to the present invention, an ASIC substrate 10 is initially processed. For this purpose, circuit elements 12 are integrated into a starting substrate 11, which may be a silicon wafer or an SOI wafer, for example. In the case of an SOI wafer, these circuit elements are integrated into the silicon functional layer of the SOI wafer. Circuit elements 12 advantageously form at least parts of a signal processing circuit for the MEMS functions of the component to be manufactured. In addition, however, MEMS-independent circuit functions may also be implemented. A layered structure 13 having multiple circuit levels 1 through 4 is produced on starting substrate 11 for the wiring of these circuit elements 12. Circuit levels 1 through 4 are implemented in the form of structured metallization levels, which are spatially and electrically separated from one another and from starting substrate 11 by insulating layers. Since in the exemplary embodiment described here the insulating layers are each an oxide layer, the individual insulating layers are not differentiated here. Rather, together these form one insulating layer 14. The electrical connection between individual metallization levels 1 through 4 is established via so-called through contacts 15. These are contact holes in the interposed insulating layers, which are filled using metal.

Individual metallization levels 1 through 4 may be implemented, for example, as structured AlSiCu layers or in copper technology. However, it is also possible to implement individual metallization levels 1 through 4 in the form of a multilayered metallization, in the case of which further layers, for example, made of TiN, Ti, TiW, and/or the combinations thereof are located below the AlSiCu layer, to increase the adhesion or to form a diffusion barrier in the contact holes.

In the case of ASIC substrate 10 shown in FIG. 1a, a structured metallization level 1 is situated on insulating layer 14. Remaining metallization levels 2 through 4 are embedded in insulating layer 14. This layered structure is always designated hereafter as a back-end stack 13 of ASIC substrate 10. Of course, the back-end stack of the ASIC element of a hybrid integrated component according to the present invention may also include more or fewer than the four metallization levels shown here.

According to the present invention, a diaphragm structure 16 having at least one deflectable electrode is applied in back-end stack 13. In the exemplary embodiment described here, individual insulating layers 14 and metallization levels 1 through 4 of layered structure 13 are structured in a suitable way and deposited one on top of another for this purpose. Diaphragm structure 16 is defined by the structure of metallization levels 1 through 4, since metallization levels 1 through 4, together with through contacts 15, form a vertical and lateral etch stop, i.e., an etch mask for the structuring process, during which diaphragm structure 16 is exposed. In the present exemplary embodiment, a coherent area of uppermost metallization level 1 of back-end stack 13 was applied as diaphragm 16. Remaining metallization levels 2 through 4 were opened in this area, so that the material of insulating layer 14 below diaphragm 16 may be removed in a rear etching attack. This etching attack is laterally delimited by through contacts 15, which are peripheral to the diaphragm area, between metallization levels 1 through 4. It is to be noted here that the microphone diaphragm does not necessarily have to be implemented as a closed surface. It may also be provided with a fine perforation.

In FIG. 1a, an MEMS substrate 20 is shown above ASIC substrate 10, which is to be mounted on back-end stack 13, in such a way that at least in the area of diaphragm structure 16, there is a gap 21 between back-end stack 13 and MEMS substrate 20. Therefore, the mounting side of MEMS substrate 20 is provided in the exemplary embodiment shown here within the scope of preprocessing with a standoff structure in the form of distance holders 22. These may be structured out of an oxide layer having a defined thickness or may be made of silicon, for example. Distance holders 22 are situated here in such a way that, after the mounting of MEMS substrate 20, they rest on insulating layer 14 of the back-end stack. However, it is also possible to situate distance holders 22 in such a way that they rest on uppermost metallization level 1 of back-end stack 13. Furthermore, it is to be mentioned here that alternatively or also additionally to distance holders 22 on the mounting side of MEMS substrate 20, a standoff structure having distance holders may also be produced on back-end stack 13 of ASIC substrate 10.

The mechanical connection between MEMS substrate 20 and back-end stack 13 is produced in the exemplary embodiment described here in a bonding method, namely by eutectic bonding. For this purpose, a germanium layer 23 is applied in the connection area on the mounting side of MEMS substrate 20, this germanium layer bonding with the AlSiCu of uppermost metallization level 1 during the bonding to form a eutectic material. In this case, not only is a frame-shaped peripheral mechanical connection 24 established, which hermetically seals gap 21 between MEMS substrate 20 and back-end stack 13, but rather also an electrical connection is established between MEMS substrate 20 and back-end stack 13. It is also to be noted here that uncontrolled lateral propagation of the eutectic material, in particular in the diaphragm area, may be prevented by stop trenches in the mounting surface of MEMS substrate 20.

Figure 1B:
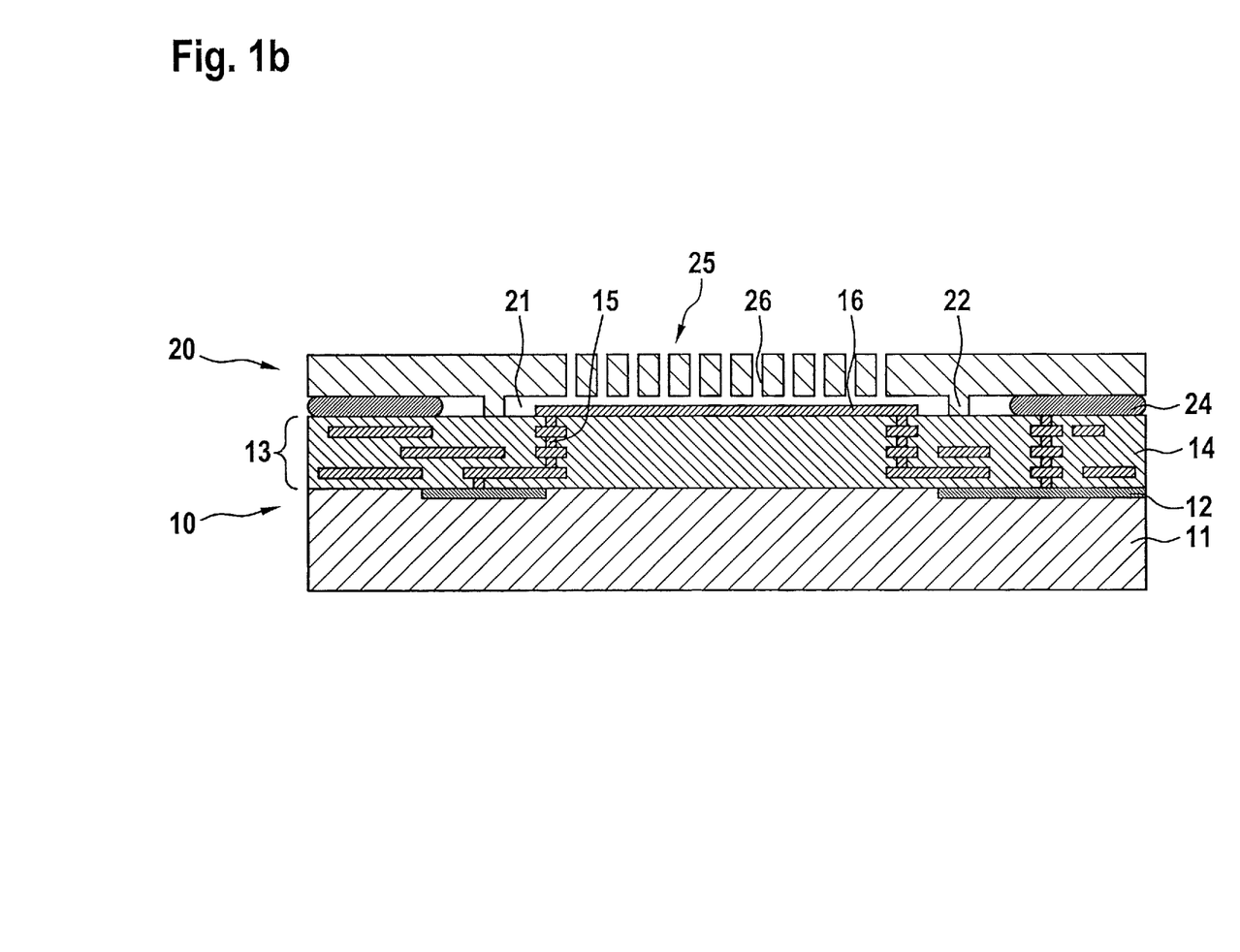

Relatively thick MEMS substrate 20 is now thinned, for example, in a CMP process and optionally a plasma etching step, until its thickness approximately corresponds to the intended structural height of the MEMS element. MEMS substrate 20 is only structured in a trenching process thereafter, insulating layer 14 and uppermost metallization level 1 of back-end stack 13 being used as an etch stop. In the present exemplary embodiment, in this way a stationary counter element 25 is produced as a counter electrode for metal diaphragm 16. Counter element 25 is provided with passage openings 26, so that it is acoustically permeable. The geometrical dimensions of passage openings 26 are designed in such a way that the best possible microphone transmission characteristic curve is achieved. FIG. 1b shows ASIC substrate 10 having back-end stack 13 after the mounting of MEMS substrate 20, from which counter element 25 was already structured. This figure additionally illustrates the function of distance holders 22 as a supplement to connecting layer 24.

Figure 1C:
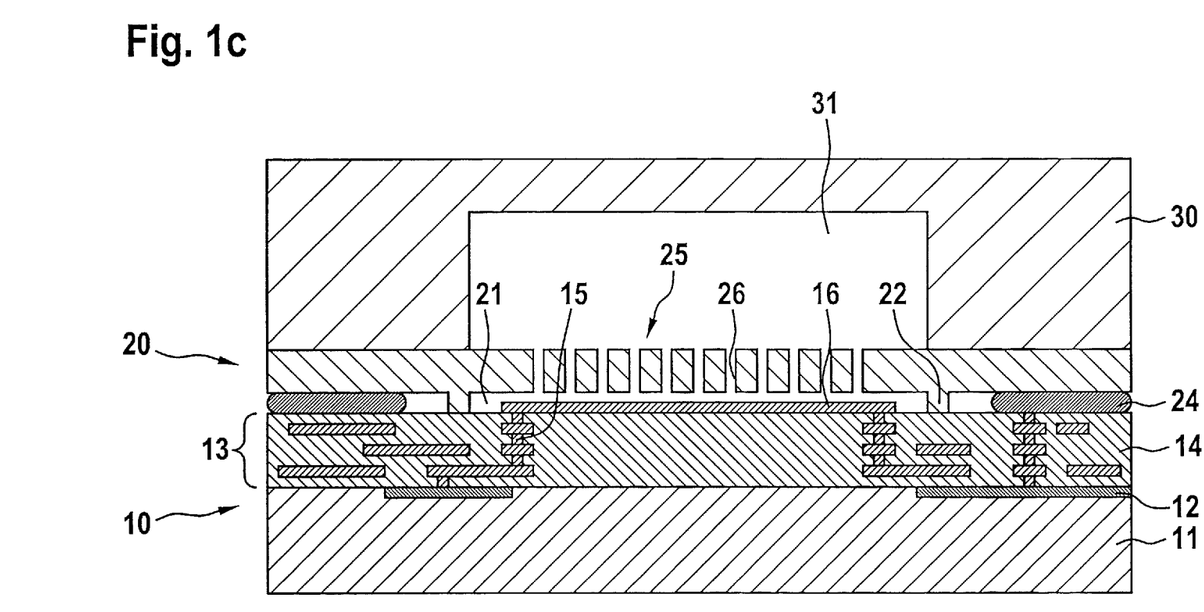

After the structuring of MEMS substrate 20, in the exemplary embodiment described here, a structured cap wafer 30 is mounted above counter element 25 on MEMS substrate 20, which is shown in FIG. 1c. Cap wafer 30 forms rear side volume 31 of the microphone component and may alternatively also be mounted on the back-end stack of the ASIC substrate, so that not only would the counter element be enclosed between the back-end stack and the cap wafer, but rather the entire MEMS element. A wafer bonding method is preferably also selected for the mounting of cap wafer 30, since in this way hermetically sealed and durable mechanical and also electrical connections may be established easily and cost-effectively. Cap wafer 30 may also be thinned after the bonding process, to reduce the component height. A defined surface roughness may be set. This proves to be reasonable in particular in regard to the second level assembly of the microphone component, if it is to be reliably fixed on a base.

ASIC substrate 10 is then also thinned on the rear side, for which purpose known methods, such as grinding, CMP, and plasma etching may be used. It is to be ensured that integrated circuit components 12 are not damaged. In addition, thinned ASIC substrate 10 must have a minimum stability as the frame for pressure connection 17 and clamping for diaphragm structure 16, which is still to be exposed, above pressure connection 17. In this context, it has proven to be advantageous if an SOI wafer was used as the ASIC starting substrate, since in the case of thinning, the oxide layer below the functional layer may be used as a defined etch stop and a defined remaining silicon thickness may be ensured, above all in the area of circuit elements 12.

Figure 1D:
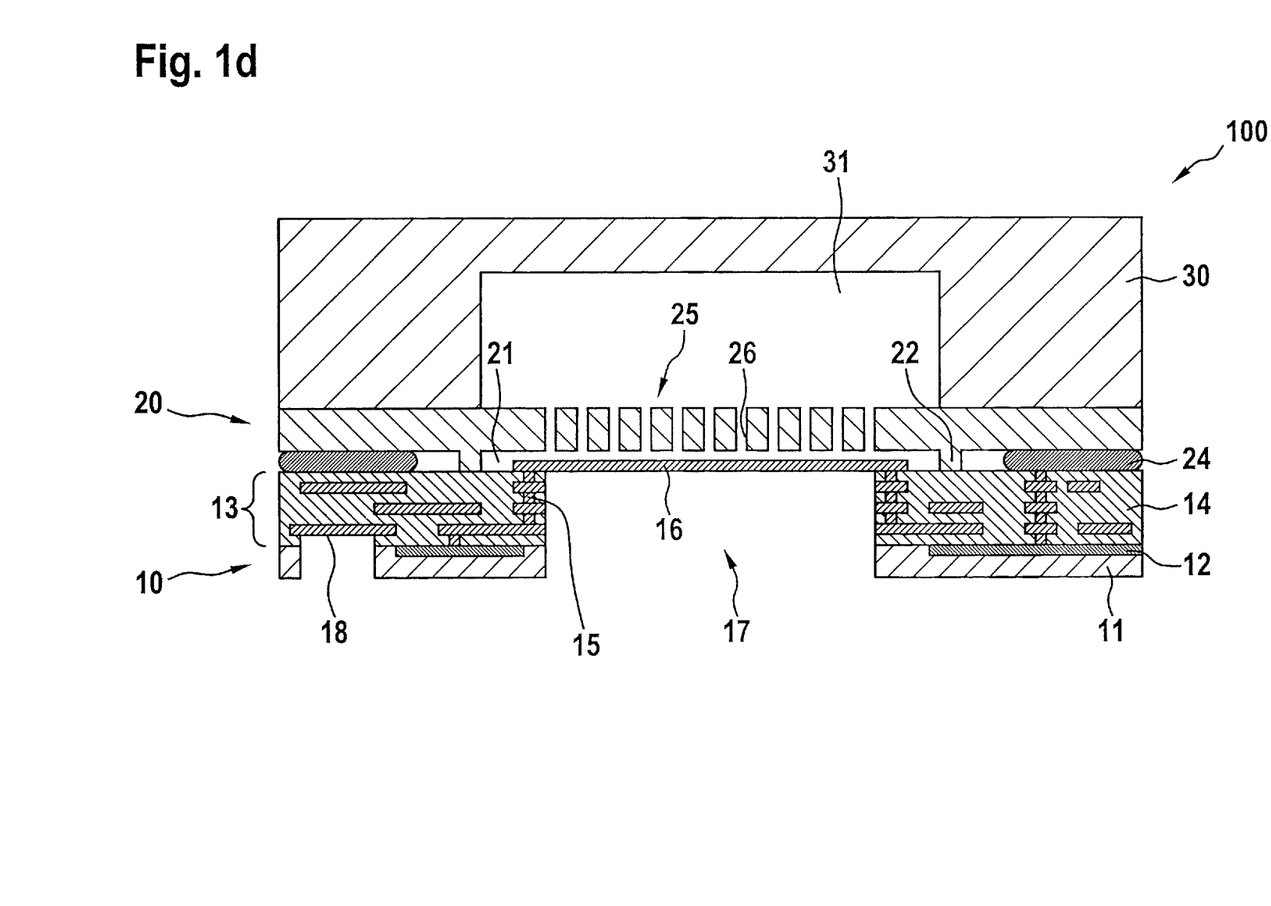

According to the present invention, diaphragm structure 16 is now exposed. For this purpose, the rear side of ASIC substrate 10 is initially masked, in order to define the opening area of rear side pressure connection 17 and a bond pad area 18. Starting substrate 11 is structured with the aid of this etch mask, in order to open pressure connection 17 and bond pad area 18. Insulating layer 14 of back-end stack 13 forms an etch stop boundary for this first etching process. The material of insulating layer 14 is then removed in a plasma etching process via the openings thus produced in starting substrate 11. During this second etching process, metallization levels 1 and 4 and also through contacts 15, which are designed as ring contacts, function as an etch stop or as an etch mask. FIG. 1d shows microphone component 100 having exposed diaphragm 16 in uppermost metallization level 1. Sound waves are applied to this diaphragm 16 via pressure connection 17 and it forms a microphone capacitor system together with stationary counter element 25 of MEMS substrate 20. The sound waves are detected as capacitance changes of this capacitor system.

Figure 1E:
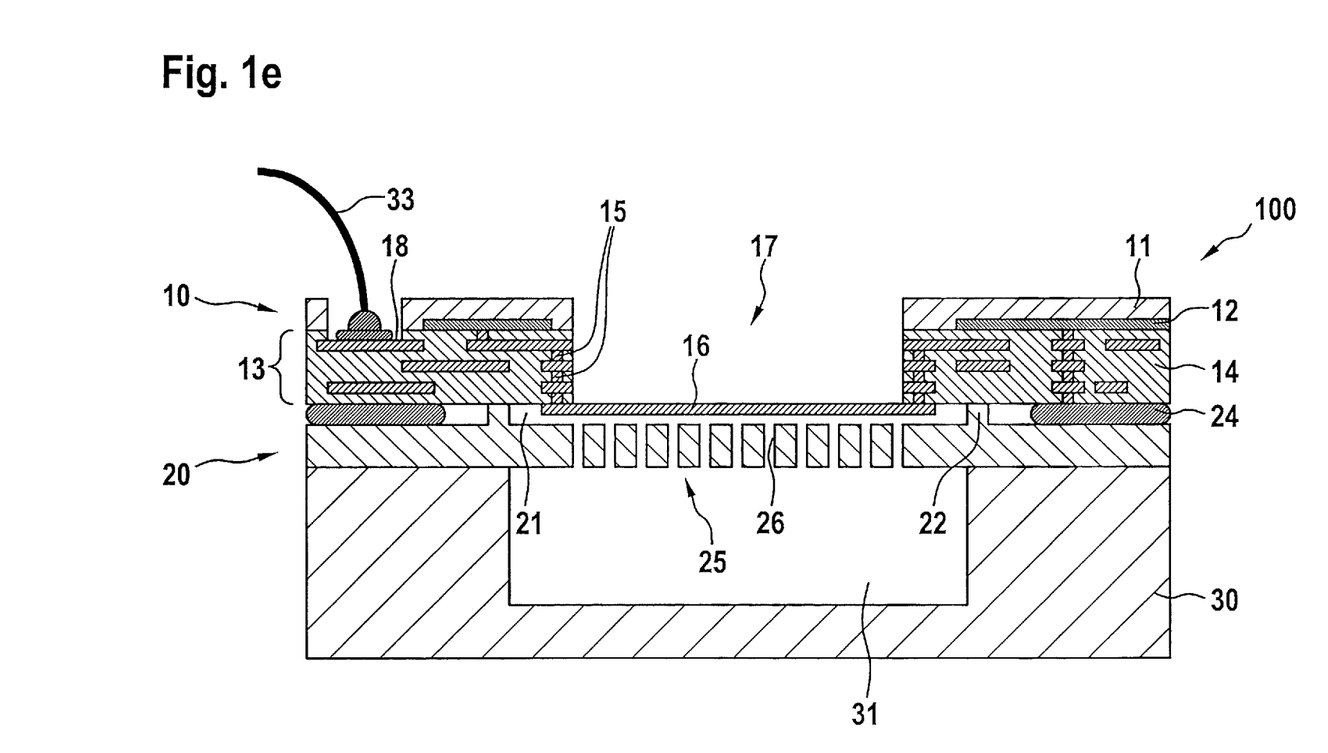

The second level assembly of microphone component 100 takes place preferably via cap wafer 30, as shown in FIG. 1e. In the present case, wire bonds 33 are provided in bond pad area 18 on the rear side of ASIC substrate 10 for the external electrical contacting of component 100. Bond pad area 18 is placed here in the area of the bond frame, in order to ensure a sufficiently stable subbase for the wire bonding.

Figure 1F:
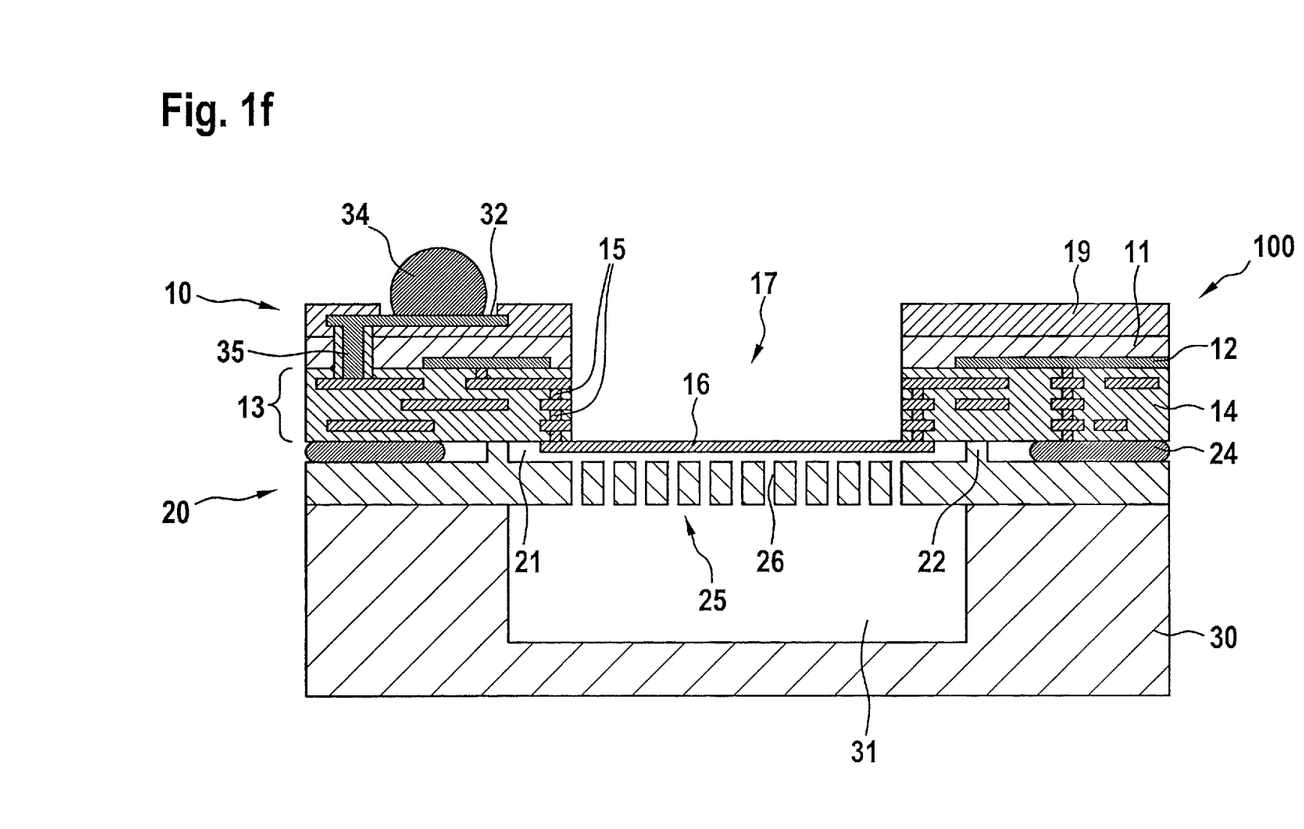

Alternatively, it is also conceivable to carry out the second level assembly of microphone component 100 using flip chip technology. However, it is necessary for this purpose to provide electrical bond pads 32 on the rear side of ASIC substrate 10 and to provide them with solder bumps 34. FIG. 1f shows how this may be technically implemented. After ASIC substrate 10 is thinned, an insulating layer 19 made of $SiO_2$, for example, and electrically insulated through contacts 35 and bond pad structures 32 made of copper, for example, are produced on the rear side surface of ASIC substrate 10 using known methods. A further insulating layer 19 made of $SiO_2$, silicon nitride, silicon oxinitride, SiC, or combinations thereof is deposited in a planar manner, the bond pad window is opened in the area of bond pad 32, and pressure connection 17 is established. Solder bumps 34 made of Pb/Sn, for example, may now be placed in the bond pad window, with the aid of which flip chip mounting may be carried out. Alternatively, it is also conceivable to already place solder bumps 34 in the bond pad windows before the establishment of pressure connection 17.

Figure 2A:
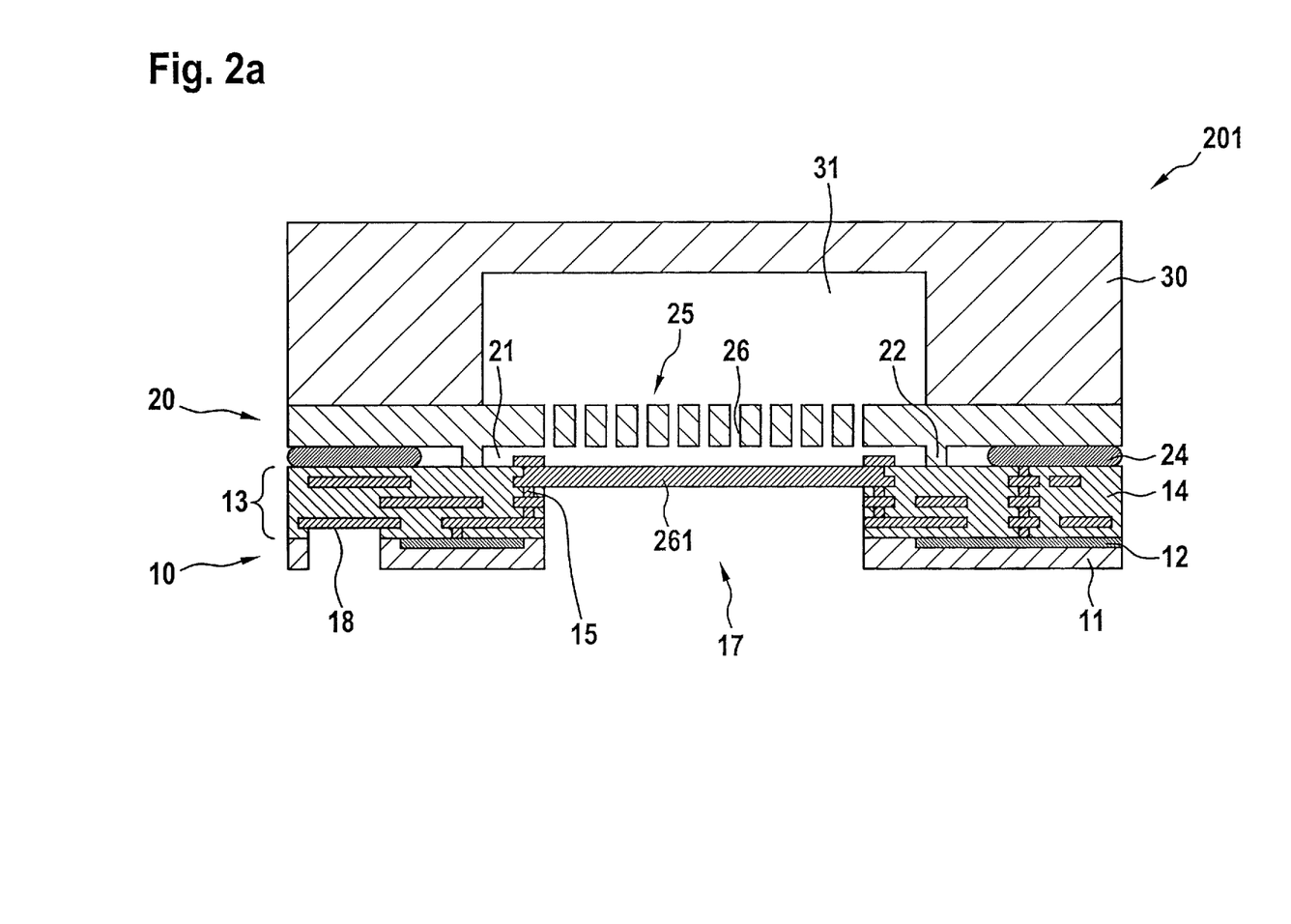
FIGS. 2a and 2b show schematic sectional views of two further microphone components 201 and 202 having a metal diaphragm.
Figure 2B:
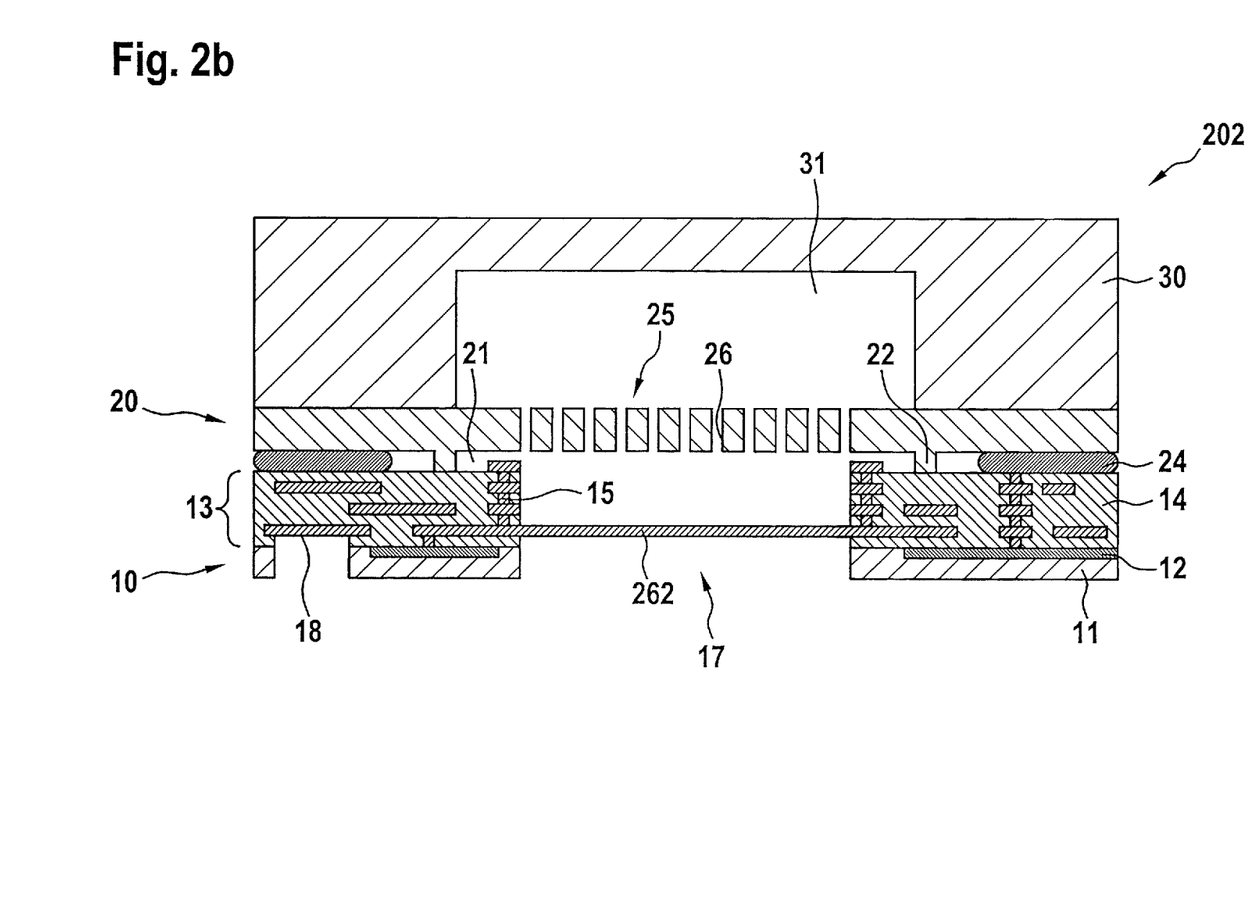

In microphone component 100 shown in FIGS 1d, 1e, and 1f, diaphragm structure 16 is implemented in uppermost metallization level 1 of ASIC back-end stack 13. Microphone components 201 and 202 shown in FIGS. 2a and 2b are also equipped with metal diaphragms 261 and 262. The only substantial difference from component 100 here is the arrangement and thickness of these metal diaphragms 261 and 262. Therefore, the following description of the figures is restricted to this aspect of the component structure. Reference is made to the explanations of FIGS. 1a through 1e for the explanation of the remaining component parts.

Metal diaphragm 261 of microphone component 201 shown in FIG. 2a is significantly thicker than diaphragm 16 of microphone component 100. For this purpose, the uppermost layers of back-end stack 13 were structured in such a way that metallization levels 1 and 2 were deposited directly one on top of the other in the diaphragm area. Metal diaphragm 261 is thus implemented here in the form of a stack made of two metallization levels 1, 2 situated directly one on top of the other.

In the case of microphone components 202 shown in FIG. 2b, metal diaphragm 262 is implemented in lowermost metallization level 4 of ASIC back-end stack 13. For this purpose, metallization levels 1 through 3 lying above it were opened in the diaphragm area. Moreover, an additional etching attack was necessary to remove the material of insulating layer 14 above diaphragm structure 262. This etching attack took place even before the mounting of MEMS substrate 20 above passage openings 26 in the counter element. Pressure connection 17 in the rear side of ASIC substrate 10 was also only produced here after the mounting of cap wafer 30. The material of insulating layer 14 below diaphragm structure 262 was then also removed. By implementing the diaphragm structure in a lower metallization level or in a lower layer area of back-end stack 13, the distance to counter element 25 in MEMS substrate 20 may be intentionally increased, without the structural height of the component having to be increased for this purpose.

Figure 3A:
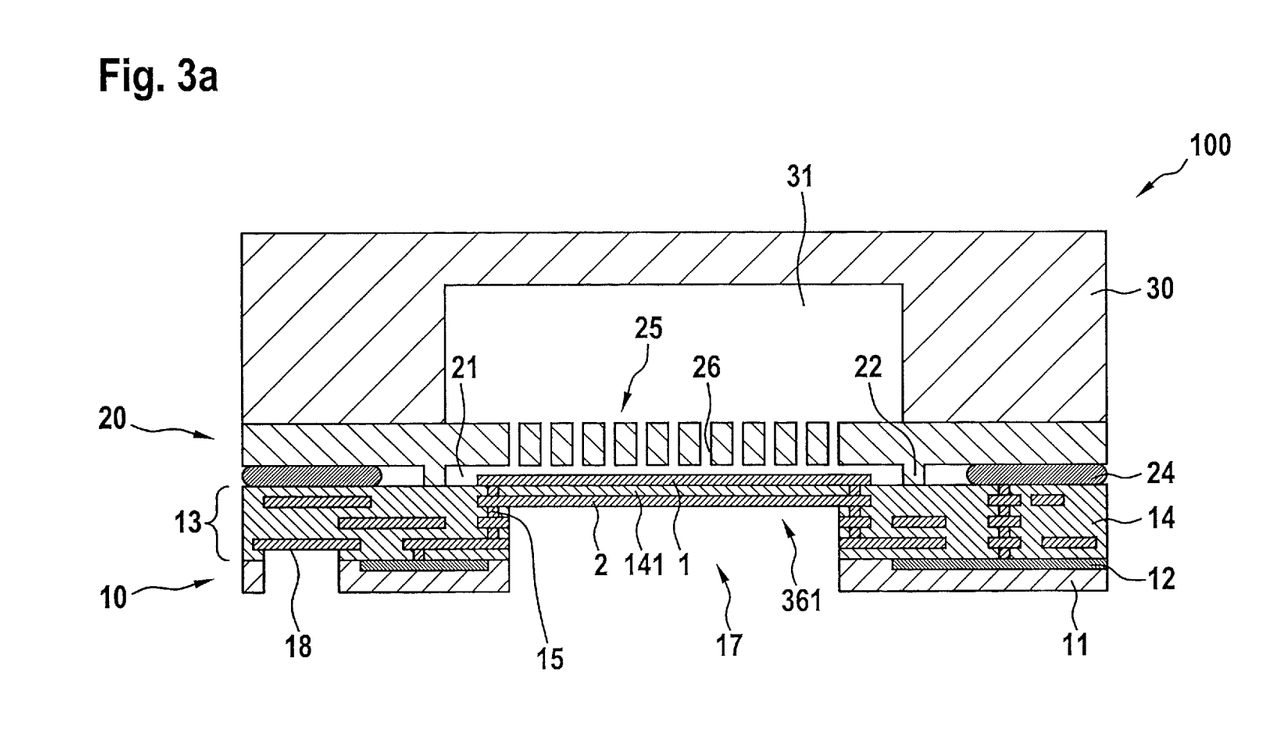
FIGS. 3a and 3b show schematic sectional views of two microphone components 301 and 302 having a diaphragm structure which is at least in some area multilayered.
Figure 3B:
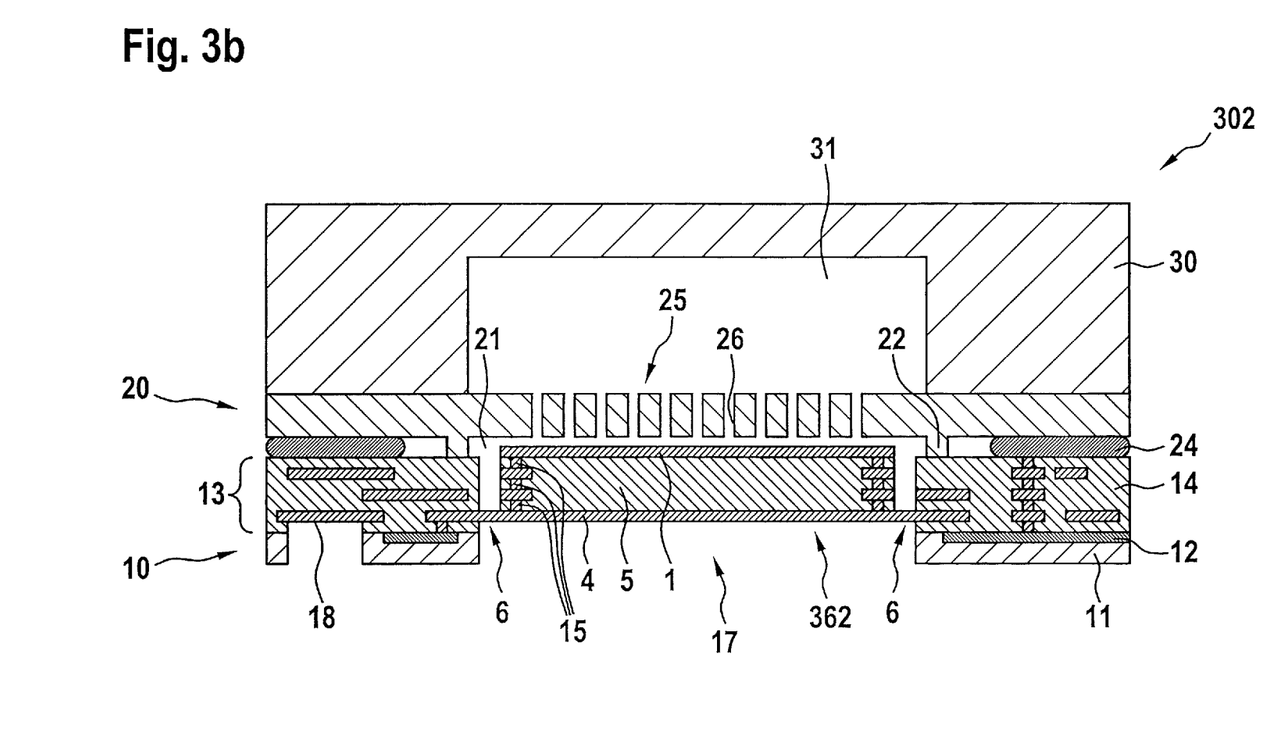

Microphone components 301 and 302 shown in FIGS. 3a and 3b also only differ in the diaphragm structure from microphone component 100 of FIGS. 1d and 1e.

Diaphragm structure 361 of microphone component 301 shown in FIG. 3a extends from uppermost metallization level 1 via insulating layer 141 lying below it down to second metallization level 2 and accordingly has a greater stiffness than diaphragm structures 16, 261, and 262 of components 100, 201, and 202. This stiffening option was used in the case of component 302 shown in FIG. 3b to implement a diaphragm structure 362 which is only stiffened in its middle area 5. This diaphragm structure 362 is only incorporated via lowermost metallization level 4 in the layered structure of back-end stack 13, but extends in its middle area 5 over all four metallization levels 1 through 4 of the back-end stack. For this purpose, ring-shaped through contacts 15, which are peripheral to the diaphragm area, were produced between metallization levels 1 through 4, these through contacts acting as a lateral etch stop during the frontal exposure of diaphragm structure 362. By suitable selection and combination of insulating layers 14, as layers having tensile or compression strength, the diaphragm strength of diaphragm structure 362 may be intentionally influenced. Diaphragm structure 362 is deformed essentially only in its edge area 6 during pressure action, while stiffened middle area 5 is deflected in a plane-parallel way. This structural measure contributes to the linearization of the microphone signal. It is also to be noted here that in the event of corresponding structuring of the individual metallization levels of the back-end stack, diaphragm structures having a stiffened middle area may also be produced, whose edge area extends over multiple layers of the back-end stack, like diaphragm structure 361 of component 301. The stiffness of the diaphragm mounting may be intentionally influenced in this way.

Figure 4A:
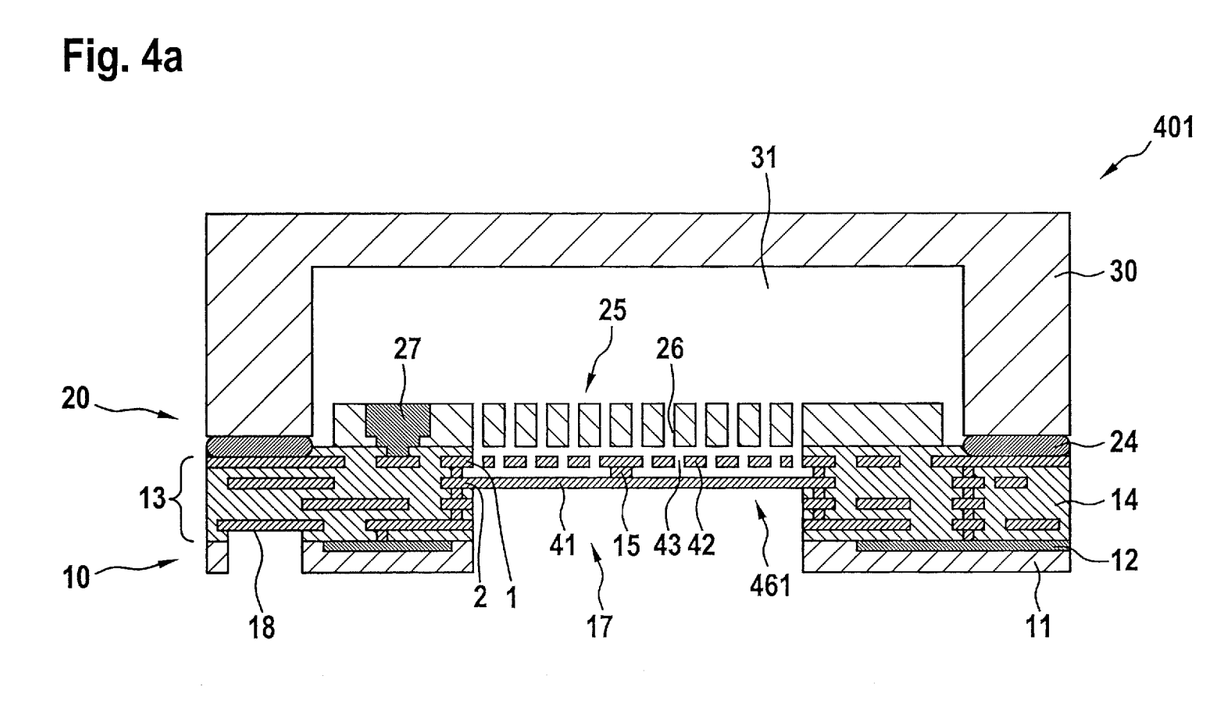
FIGS. 4a and 4b show schematic sectional views of two microphone components 401 and 402 having a special diaphragm and electrode design.
Figure 4B:
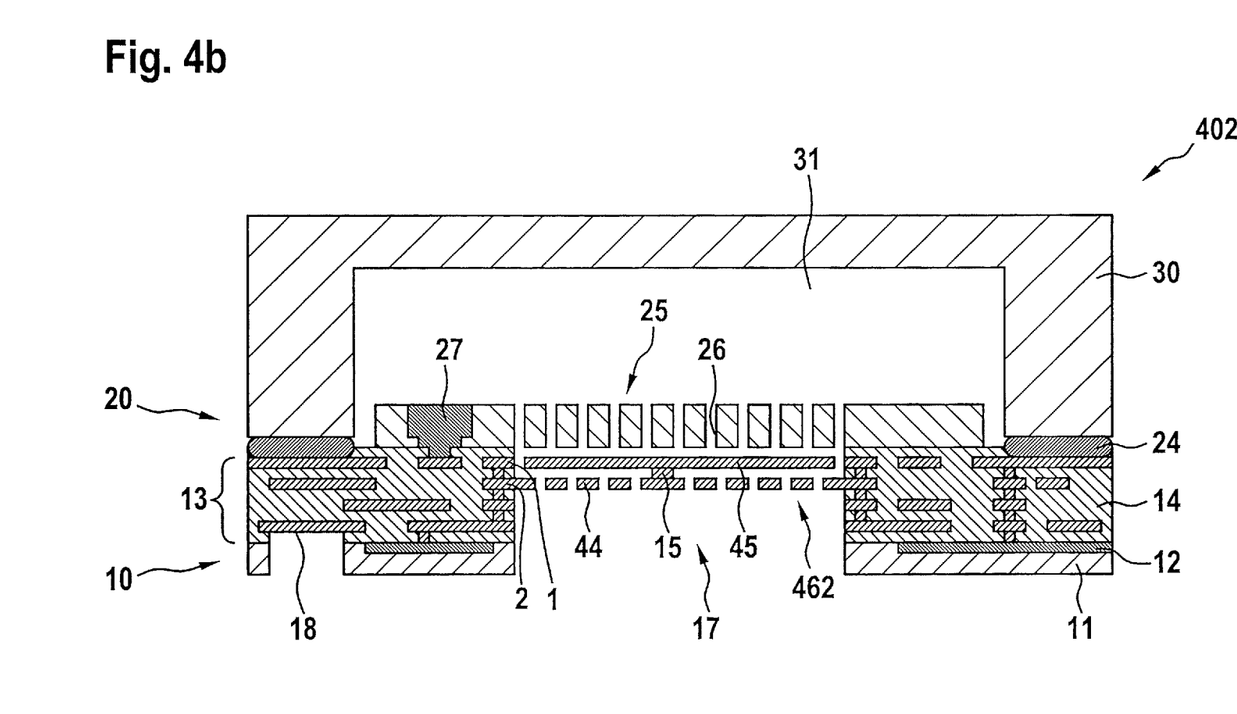

In the case of components 401 and 402 shown in FIGS. 4a and 4b, cap wafer 30 is mounted in each case directly on back-end stack 13 of ASIC substrate 10, so that entire MEMS element 20 is enclosed within rear side volume 31 between cap wafer 30 and ASIC substrate 10. These figures additionally illustrate that electrical connections exist between MEMS element 20 and ASIC substrate 10. The electrical connections are established via through contacts 27 in MEMS element 10, one of which is shown here, which rests on uppermost metallization level 1 of back-end stack 13.

Furthermore, electrical connections are also conceivable between cap wafer 30 and ASIC substrate 10, to be able to set cap wafer 30 to a defined electrical potential.

Diaphragm structure 461 of component 401 includes a pressure-sensitive diaphragm element 41 and an electrode element 42, which is deflected together with diaphragm element 41. Diaphragm element 41 is implemented here as a closed metal diaphragm in second metallization level 2. Electrode element 42 was structured out of adjacent metallization level 1 and provided with passage openings 43. It is only connected at points via a centrally arranged through contact 15 to diaphragm element 41. Otherwise, electrode element 42 is not incorporated in the layered structure of back-end stack 13. This design also contributes to the linearization of the microphone signal, since pressure-related deformations of diaphragm element 41 cause a plane-parallel deflection of electrode element 41.

In addition to a central suspension of electrode element 42, a multipoint suspension is also conceivable, if all suspension points are located on the same height line in the case of the deflection of diaphragm element 41.

In component variant 402 shown in FIG. 4b, diaphragm structure 462 also includes a diaphragm element 44, which is implemented in second metallization level 2, and an electrode element 45, which is implemented in adjacent metallization level 1. Electrode element 45—as in the case of component 401—is only connected at points via a centrally situated through contact 15 to diaphragm element 44 and is otherwise not incorporated in the layered structure of back-end stack 13. In contrast to component 401, however, diaphragm element 44 is perforated in the case of component 402, while electrode element 45 is designed as a closed metal electrode. The characteristic curve and dynamic response of microphone component 402 may be intentionally influenced with the aid of such a perforation of diaphragm element 44. Pressure-related deformations of diaphragm element 44 also result in a plane-parallel deflection of electrode element 45 here.

In addition to a central suspension of electrode element 45, a multipoint suspension is also conceivable in this example, if all suspension points are located on the same height line in the case of the deflection of diaphragm element 44.

Finally, it is to be noted that in all above-described exemplary embodiments, still further layers may be deposited on the diaphragm structure to influence the diaphragm stress.

What is claimed is:

1. A hybrid integrated component, comprising:
   an ASIC element having integrated circuit elements and a back-end stack;
   an MEMS element having a substrate and a micromechanical structure which extends over the entire thickness of the substrate of the MEMS element; and
   a cap wafer;
   wherein the MEMS element is mounted on the ASIC element in such a way that a gap exists between the micromechanical structure and the back-end stack of the ASIC element, and the cap wafer is mounted above the micromechanical structure of the MEMS element, and wherein a pressure-sensitive diaphragm structure having at least one deflectable electrode of a capacitor system is implemented in the back-end stack of the ASIC element, and the diaphragm structure spans a pressure connection in the rear side of the ASIC element.

2. The component as recited in claim 1, wherein the diaphragm structure having the deflectable electrode is implemented in at least one metallization level of the back-end stack.

3. The component as recited in claim 2, wherein the diaphragm structure has a layered structure, which includes multiple metallization levels and insulating layers.

4. The component as recited in claim 3, wherein two outer layers of the diaphragm structure are each metallization levels of the back-end stack.

5. The component as recited in claim 3, wherein a middle area of the diaphragm structure is stiffened by having a greater thickness than an edge area of the diaphragm structure.

6. The component as recited in claim 3, wherein:
   the diaphragm structure includes a pressure-sensitive diaphragm element and at least one electrode element;
   an edge area of the pressure-sensitive diaphragm element is incorporated in the layered structure of the back-end stack; and
   the electrode element is only connected at selected points via at least one through contact to the pressure-sensitive diaphragm element, and the electrode element is otherwise not connected to the layered structure of the back-end stack.

7. The component as recited in claim 3, wherein at least one stationary counter element is implemented as a carrier for at least one stationary counter electrode of the capacitor system in the micromechanical structure of the MEMS element.

8. The component as recited in claim 7, wherein the micromechanical structure of the MEMS element includes at least one structural element for a pressure-independent sensor or actuator function.

9. The component as recited in claim 3, wherein the MEMS element is mounted via a standoff structure on the ASIC element, and the standoff structure is implemented in the form of at least one structured layer on at least one of the MEMS substrate and the ASIC substrate.

10. The component as recited in claim 9, wherein the cap wafer is mounted on one of the MEMS element or the ASIC element.

11. The component as recited in claim 3, wherein the component is one of a capacitive microphone, a loudspeaker, a pressure sensor, or a pressure switch component.

12. A method for manufacturing a hybrid integrated component, comprising:
   integrating circuit elements into an ASIC substrate;
   producing a back-end stack on the ASIC substrate, wherein a diaphragm structure having at least one deflectable electrode is applied in the back-end stack, and wherein the diaphragm structure is exposed in the back-end stack;
   mounting an MEMS substrate on the back-end stack of the ASIC substrate in such a way that a gap exists between the MEMS substrate and the back-end stack of the ASIC substrate;
   structuring an entire thickness of the mounted MEMS substrate;
   producing a pressure connection in the rear side of the ASIC substrate; and
   mounting a cap wafer above the micromechanical structure of the MEMS substrate.

13. The method as recited in claim 12, wherein:
   the diaphragm structure is applied in the back-end stack by depositing insulating layers and metallization levels of the back-end stack one on top of another, and subsequently structuring the deposited insulating layers and the metallization levels; and
   the diaphragm structure is exposed by removing the material of the insulating layers in the diaphragm area via passage openings in the micromechanical structure of the MEMS substrate starting from the rear side of the ASIC substrate using an etching method, the metallization levels of the back-end stack functioning as a vertical etch stop and through contacts between individual metallization levels functioning as a lateral etch stop.

* * * * *